(12) United States Patent
Nakayama (10) Patent No.: US 6,396,146 B2
(45) Date of Patent: *May 28, 2002

(54) SEMICONDUCTOR DEVICE AND ITS MANUFACTURING METHOD

(75) Inventor: Takeo Nakayama, Yokohama (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/195,614

(22) Filed: Nov. 19, 1998

(30) Foreign Application Priority Data

Nov. 20, 1997 (JP) .............................. 9-319709

(51) Int. Cl.⁷ .......................... H01L 23/48; H01L 29/00
(52) U.S. Cl. ...................... 257/758; 257/522; 257/776
(58) Field of Search ................. 257/758, 759, 257/760, 773–776, 522; 438/622

(56) References Cited

U.S. PATENT DOCUMENTS

| | | | | |
|---|---|---|---|---|
| 5,461,003 A | * | 10/1995 | Havemann et al. | 438/666 |
| 5,519,250 A | * | 5/1996 | Numata | 257/649 |
| 5,792,706 A | * | 8/1998 | Michael et al. | 438/626 |
| 5,835,987 A | * | 11/1998 | Givens | 257/522 |
| 5,861,674 A | * | 1/1999 | Ishikawa | 257/758 |
| 5,863,832 A | * | 1/1999 | Doyle et al. | 438/622 |
| 6,091,130 A | | 7/2000 | Oyamatsu et al. | 257/619 |

FOREIGN PATENT DOCUMENTS

| | | | |
|---|---|---|---|
| JP | 63-211739 | * | 9/1988 |
| JP | 10-189509 | | 7/1998 |

* cited by examiner

Primary Examiner—Steven Loke
Assistant Examiner—Hung Kim Vu
(74) Attorney, Agent, or Firm—Banner & Witcoff, Ltd.

(57) ABSTRACT

Dummy patterns are formed in signal patterns of a first metal layer, an insulating film covering such patterns is flattened by CMP, and only dummy patterns are selectively etched by anisotropic etching through holes opened at specific intervals. Then the opened holes are filled with an insulating film, and cavities are formed. In the upper part of the cavity, a signal line of the second metal layer is formed. As a result, a semiconductor device is provided by the CMP flattening technology without being accompanied by increase of parasitic capacity between signal lines by metal dummy patterns or shorting due to dust and the like.

5 Claims, 7 Drawing Sheets

SEMICONDUCTOR DEVICE AND ITS MANUFACTURING METHOD

BACKGROUND OF THE INVENTION

The present invention relates to a semiconductor device and its manufacturing method, and more particularly to a multi-layer metal wiring technology.

Hitherto, in a semiconductor device having metal wiring of two or more layers, when the lower surface of the metal wiring layer is flattened by CMP (chemical mechanical polishing) technology, a dummy pattern is generally disposed for enhancement of its flatness.

Figure 27:
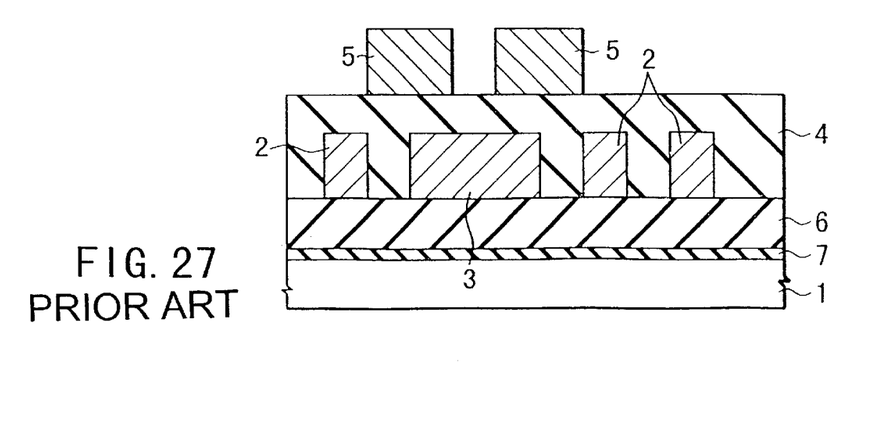
FIG. 27 is a sectional structural diagram showing a constitution of a conventional semiconductor device.

FIG. 27 is a sectional view showing a constitution for disposing two-layer metal wiring on a semiconductor device. After forming a semiconductor element, an interlayer insulating film 6, and the like on a silicon substrate 1, the metal wiring layer of first layer is patterned by lithographic technology and reactive ion etching technology. As a result, a signal line pattern 2 and a dummy pattern 3 for enhancing the flatness in the subsequent CMP process are formed.

Consequently, after depositing an $SiO_2$ interlayer insulating film 4 by plasma CVD technology, the interlayer insulating film 4 is flattened by the CMP technology so that the metal pattern of the first layer may not be exposed. Same as in the first layer, next, the signal line pattern 5 is patterned by the lithographic technology and reactive ion etching technology. In this way, in the metal wiring layer of the first layer, a dummy pattern 3 is present besides the signal line 2 and power source wire actually used as wiring.

In such conventional constitution, by placing the dummy pattern for enhancing the flatness in CMP flattening process, a problem of increase of parasitic capacity between signal lines occurs. As the parasitic capacity between signal lines increases, not only the signal propagation speed is lowered, but also the noise resistance of the device drops. Besides, owing to the dummy pattern, the resistance to dust becomes weaker, and the signal lines are shorted, and probability of lowering of yield becomes higher. Still worse, since the dummy pattern is in an electrically floating state, simulation by circuit simulator is difficult, and the circuit design is very difficult.

BRIEF SUMMARY OF THE INVENTION

The present invention is devised to solve the aforementioned problems, and it is hence an object thereof to provide a semiconductor device manufactured by CMP flattening process not accompanied by increase of parasitic capacity between signal lines due to metal dummy pattern used for CMP flattening, shorting due to dust and the like, or complication of circuit design, and a method of manufacturing the same.

To achieve the aforementioned object, according to the present invention, after completion of flattening by CMP, a dummy pattern is selectively etched by anisotropic etching through holes opened at specific intervals, and the opened holes are filled with an insulating film, and a cavity is formed. By forming a cavity in the portion of the dummy pattern in this manner, it is intended to solve the problem of parasitic capacity and difficulty of circuit design.

That is, the semiconductor device of the present invention comprises wiring patterns and dummy patterns formed on a first insulating film, a second insulating film provided in a region on the first insulating film containing the wiring patterns and dummy patterns, having the surface flattened by CMP, and second wiring patterns disposed on the second insulating film, in which the dummy patterns are formed selectively in cavities.

A semiconductor device manufacturing method of the present invention comprises a step of forming plural wiring patterns and plural dummy patterns on the first insulating film, a step of depositing a second insulating film in a region on the first insulating film including the plural wiring patterns and dummy patterns, a step of flattening the surface of the second insulating film by using the CMP technology, a step of selectively providing opening holes in the second insulating film on the plural dummy patterns, a step of etching the dummy patterns through the opening holes, a step of depositing a third insulating film in a region on the second insulating film including the opening holes, and a step of forming second wiring patterns on the third insulating film.

Since the dummy patterns are selectively etched by the anisotropic etching after completion of flattening by CMP, cavities are formed in the dummy patterns. As a result, the parasitic capacity between the signal lines decreases, and complication of circuit design can be prevented.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Referring to the drawings, preferred embodiments of the present invention are described in detail below.

FIG. 1 to FIG. 10 show the manufacturing process of a semiconductor device having metal wiring, and are sectional views for explaining part of the manufacturing process of the present invention having a dummy pattern etching step.

Figure 1:
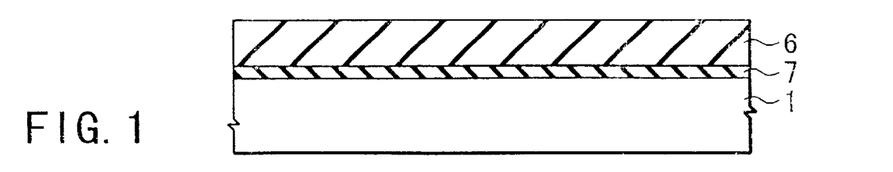
FIG. 1 is a sectional structural diagram for explaining a manufacturing process of a semiconductor device of the present invention.

First, as shown in FIG. 1, on a P-type silicon single crystal substrate 1, for example, a MOSFET (not shown) and an element separation region 7 are formed by a known technology. Then, a phosphorus-containing $SiO_2$ film is deposited as an interlayer insulating film 6 in 7000 angstroms by chemical vapor phase growth method, and it is further flattened by CMP technology.

Figure 2:
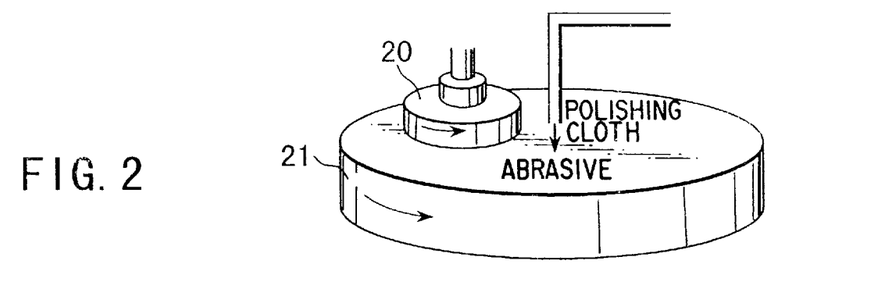
FIG. 2 is a perspective view for explaining a CMP technology.

This CMP is a technology of flattening the film on the wafer while etching by a complex process of chemical reaction and mechanical polishing between the film to be polished and the abrasive. The apparatus consists of, as shown in FIG. 2, a head 20 sucking the wafer with the surface down, and a table 21 on which an independently rotating polishing cloth is adhered, and the head 20 is pressed against the table 21 while injecting the abrasive to polish.

The CMP technology is applied in flattening of the interlayer insulating film, burying of multi-layer metal, or burying of poly-Si into trench, and it is used in mass production since start of manufacture of 64M DRAM. When the film to be polished varies, aside from the polishing condition (applied load, table rotating number and the like), the abrasive and polishing cloth are different. As abrasive particles, colloidal silica, cerium oxide, aluminum oxide and the like may be used. As the polishing cloth, various types may be used, including soft and stiff materials, and flat and fluted materials.

In application of CMP in device manufacturing process, what is important is the method of detecting the end point to determine when to stop polishing, and the method of cleaning after CMP process. As the end point detecting method, the polishing time is calculated from the polishing rate to the film thickness to be polished, and the end point is detected. Besides, since the CMP is cutting of wafer surface by abrasive, in principle, it is a process accompanied by generation of particles, and the wafer surface is contaminated by metal impurities and the like in the abrasive, and hence after-process cleaning is important. As the method of cleaning, what is most general is the brushing method for removing particles physically. Since several kinds of films appear on the surface after CMP, particles and metal impurities must be removed from all of them. To remove them, surface active agents and the like are added, and the removal level is considerably improved.

Figure 3:
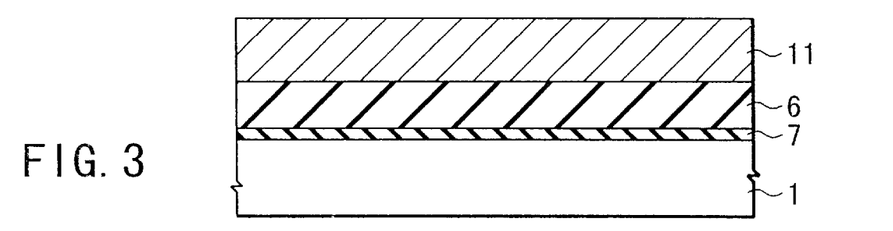
FIG. 3 is a sectional structural diagram for explaining a manufacturing process of a semiconductor device of the present invention.
Figure 4:
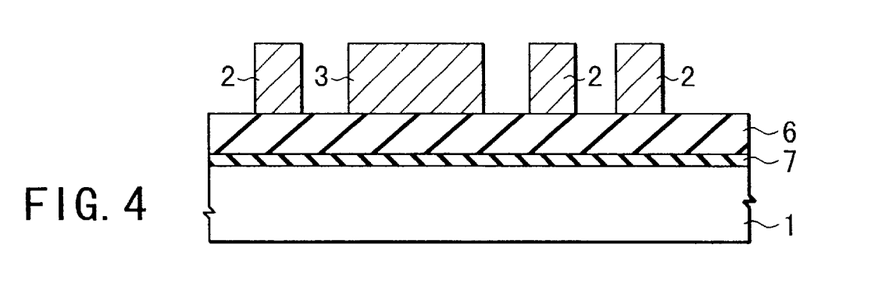
FIG. 4 is a sectional structural diagram for explaining a manufacturing process of a semiconductor device of the present invention.

After such flattening by CMP, as shown in FIG. 3, a metal wiring film 11 (Al—Si—Cu alloy or the like) is formed in a thickness of 7000 angstroms by sputtering. Consequently, as shown in FIG. 4, the metal wiring of the first layer is patterned by lithographic technology and reactive ion etching (RIE) technology. As a result, the wiring 2 used as signal line and dummy pattern 3 for enhancing the flatness in CMP flattening are formed.

Figure 5:
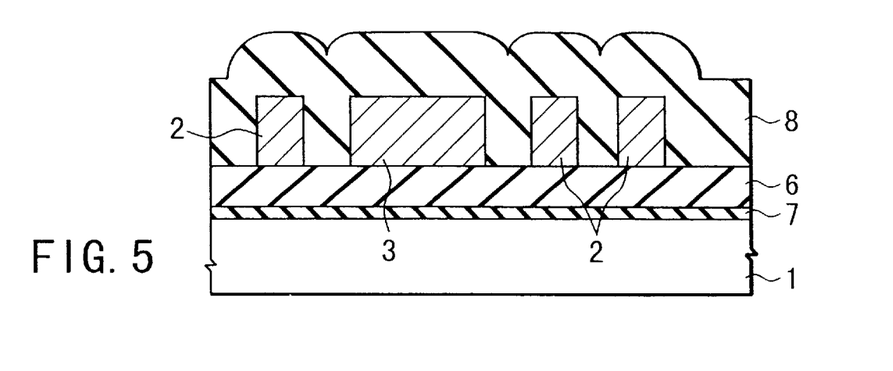
FIG. 5 is a sectional structural diagram for explaining a manufacturing process of a semiconductor device of the present invention.

Consequently, as shown in FIG. 5, an $SiO_2$ interlayer insulating film 8 is deposited in 14000 angstroms by plasma CVD technology. Then, as shown in FIG. 6, the interlayer insulating film 8 is flattened by the CMP technology so that the metal patterns 2, 3 of the first layer may not be exposed.

Figures 6, 7:
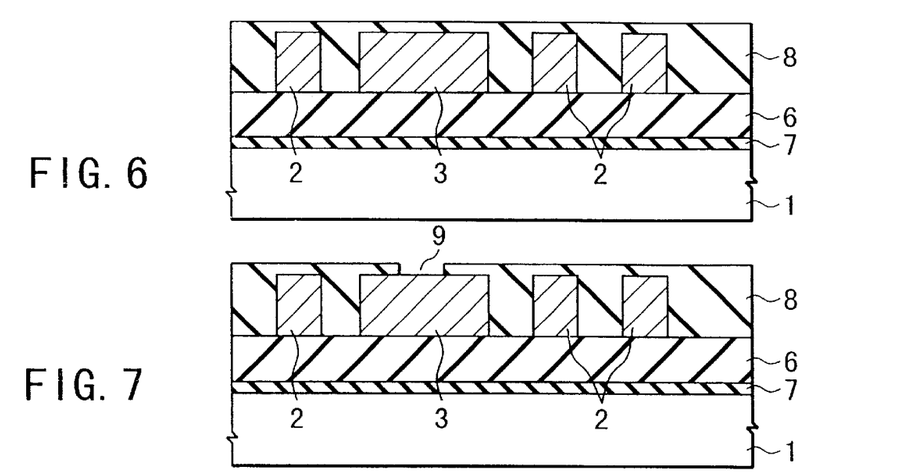
FIG. 6 is a sectional structural diagram for explaining a manufacturing process of a semiconductor device of the present invention.
FIG. 7 is a sectional structural diagram for explaining a manufacturing process of a semiconductor device of the present invention.
Figure 8:
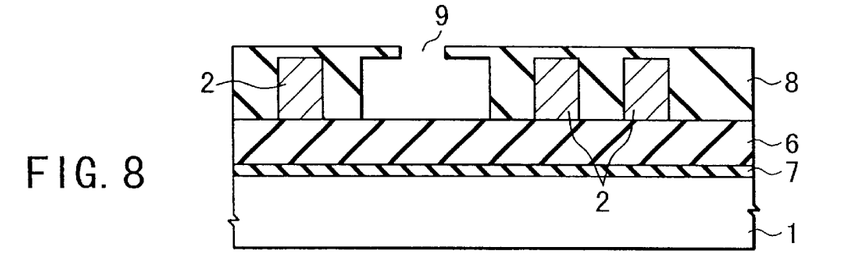
FIG. 8 is a sectional structural diagram for explaining a manufacturing process of a semiconductor device of the present invention.

Next, as shown in FIG. 7, by the lithographic technology and reactive ion etching technology in the condition for selectively etching the interlayer insulating film 8, opening holes for dummy pattern etching, that is, holes 9 are opened. In succession, as shown in FIG. 8, by using an etching solution mixing sulfuric acid and hydrogen peroxide by 1:1, the metal pattern 3 of the first layer used as dummy pattern is selectively etched anisotropically.

Figure 9:
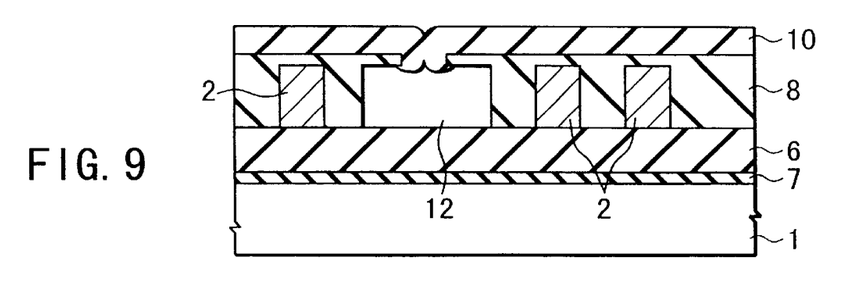
FIG. 9 is a sectional structural diagram for explaining a manufacturing process of a semiconductor device of the present invention.

As shown in FIG. 9, sequentially, in order to plug the holes 9 opened for dummy pattern etching, an $SiO_2$ interlayer insulating film 10 is deposited by 7000 angstroms again by plasma CVD technology. As a result, the holes 9 are filled with the insulating film 10. Then, a through-hole for coupling the metal of the first layer and the metal of the second layer is formed by lithographic technology and reactive ion etching technology (not shown).

Figure 10:
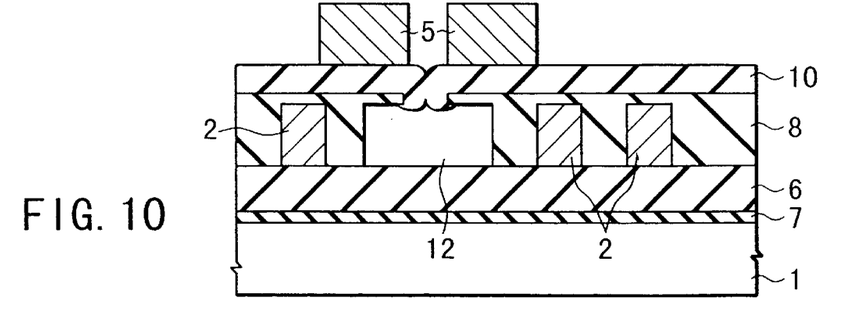
FIG. 10 is a sectional structural diagram for explaining a manufacturing process of a semiconductor device of the present invention.

As the metal wiring film of the second layer, a metal wiring film (Al—Si—Cu alloy or the like) is formed in 7000 angstroms by sputtering, and the metal wiring of the second layer is patterned by lithographic technology and reactive ion etching technology as shown in FIG. 10. As a result, the wiring 5 used as the signal line of the metal wiring of the second layer is formed. Then, forming a passivation film by a known technology, the pad portion is selectively opened as electrode.

The dummy pattern shape of the present invention for enhancing the flatness in the case of CMP flattening, and various examples of constitution and operation of opening holes for etching the dummy pattern are explained below by referring to FIG. 11 to FIG. 26.

Figure 11A:
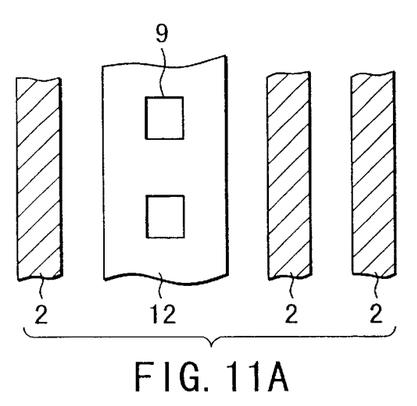
FIGS. 11A and 11B are plan views showing a constitution of a semiconductor device of the present invention.
Figure 11B:
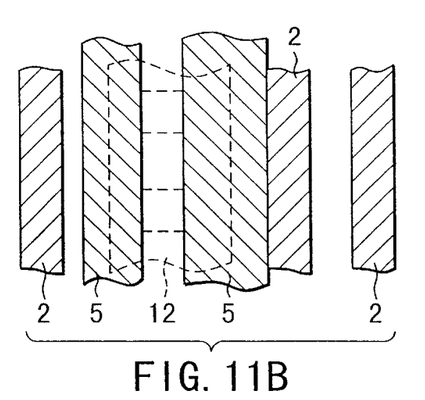

FIG. 11A is a plan view showing an example of constitution of forming a relatively large dummy pattern as compared with the wiring pattern 2, etching this dummy pattern through plural opening holes 9, and forming cavities 12. FIG. 11B is a plan view of fabricating up to the second layer wiring pattern 5 of the upper layer as compared with the constitution in FIG. 11A.

Figure 12A:
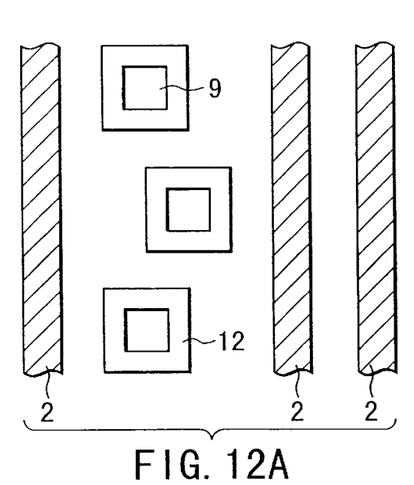
FIGS. 12A and 12B are plan views showing a constitution of a semiconductor device of the present invention.
Figure 12B:
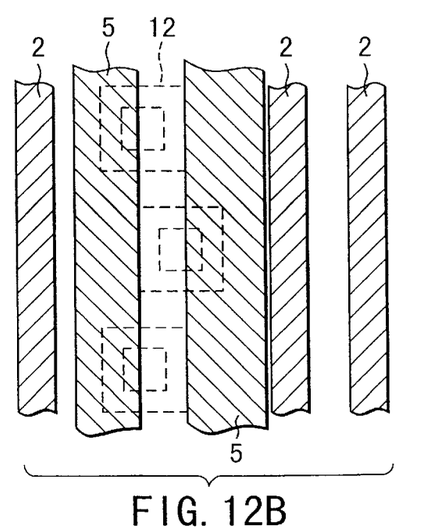

FIG. 12A shows an example of constitution of forming plural rectangular dummy patterns in the wiring pattern 2, etching the dummy patterns through individual opening holes 9, and forming cavities 12. FIG. 12B is a plan view of fabricating up to the second layer wiring pattern 5 of the upper layer as compared with the constitution in FIG. 12A.

Figure 13:
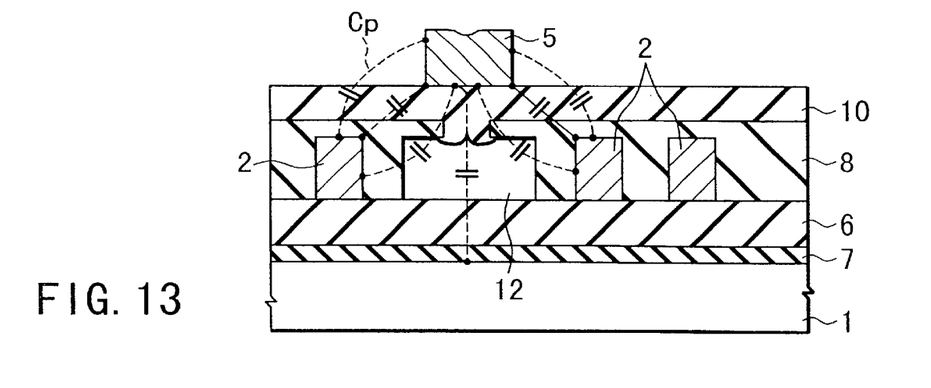
FIG. 13 is a sectional view for explaining the operation of a semiconductor device of the present invention.

FIG. 13 is a sectional view of composing the second layer metal wiring of the upper layer in the upper part of the cavity. As shown in the diagram, when the second layer metal wiring 5 is formed on the cavity 12, the parasitic capacity $C_P$ of the upper layer wiring includes the space portion of the cavity 12. As a result, the delay of the signal transmitted through the second layer metal wiring 5 may be smaller as compared with the case in which the dummy pattern is present as metal pattern.

FIG. 14 to FIG. 26 are diagrams for explaining part of the manufacturing process of the semiconductor device according to the present invention, by forming plural dummy patterns in metal wirings, etching these dummy patterns selectively, and forming cavities.

Figure 14:
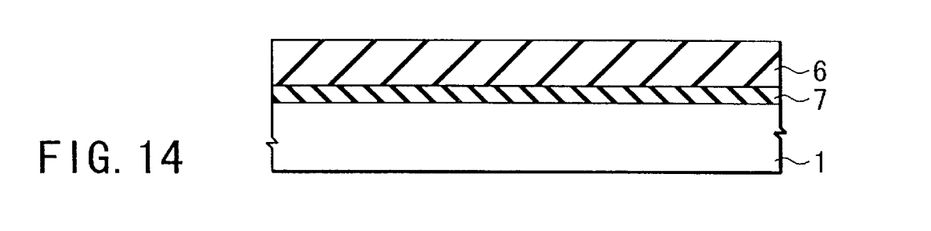
FIG. 14 is a sectional structural diagram for explaining a manufacturing process of a semiconductor device of the present invention.

First, as shown in FIG. 14, on a P-type silicon single crystal substrate 1, for example, an element separation region 7 and MOSFET (not shown) are formed by a known technology. Then, a phosphorus-containing $SiO_2$ interlayer insulating film 6 is deposited in 7000 angstroms by chemical vapor phase growth method, and it is further flattened by CMP technology.

Figure 15:
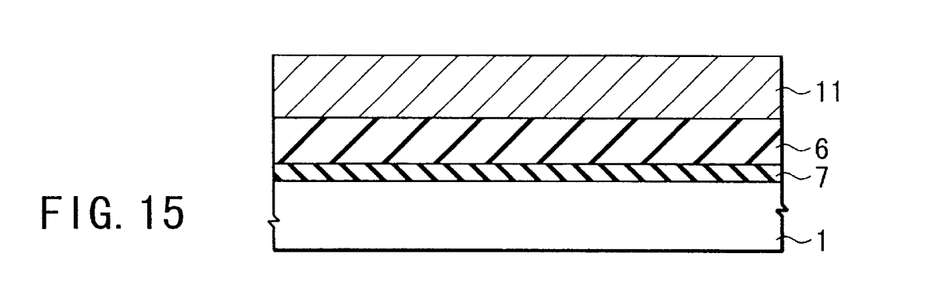
FIG. 15 is a sectional structural diagram for explaining a manufacturing process of a semiconductor device of the present invention.

Next, as shown in FIG. 15, a metal wiring film 11 (Al—Si—Cu alloy or the like) is formed in 7000 angstroms by sputtering technology.

Figure 16:
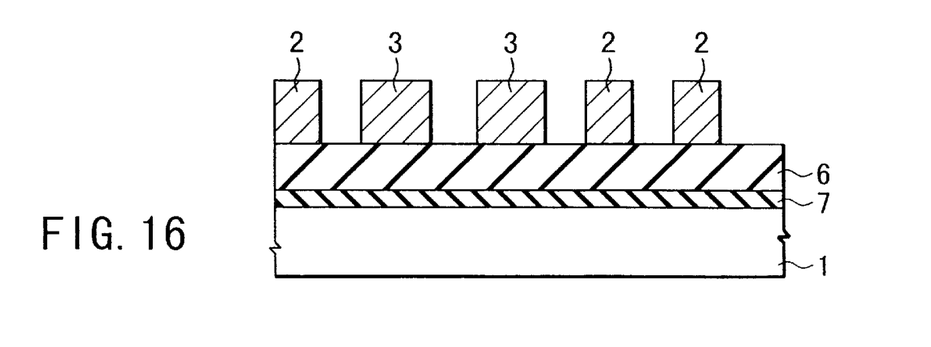
FIG. 16 is a sectional structural diagram for explaining a manufacturing process of a semiconductor device of the present invention.
Figure 17:
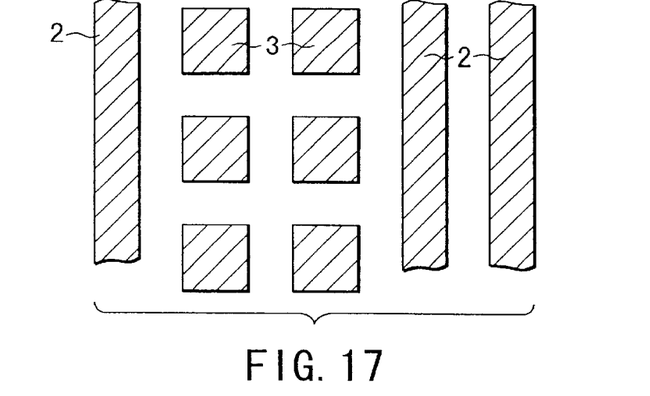
FIG. 17 is a plan view for explaining a manufacturing process of a semiconductor device of the present invention.

As shown in FIG. 16, consequently, the metal layer of first layer is patterned by lithographic technology and reactive ion etching technology by RIE. As a result, the wiring 2 used as signal line and dummy pattern 3 for enhancing the flatness in flattening are formed. FIG. 17 shows a plan view at this time. In this way, the dummy pattern 3 for enhancing the flatness when flattening is divided into plural sections.

Figure 18:
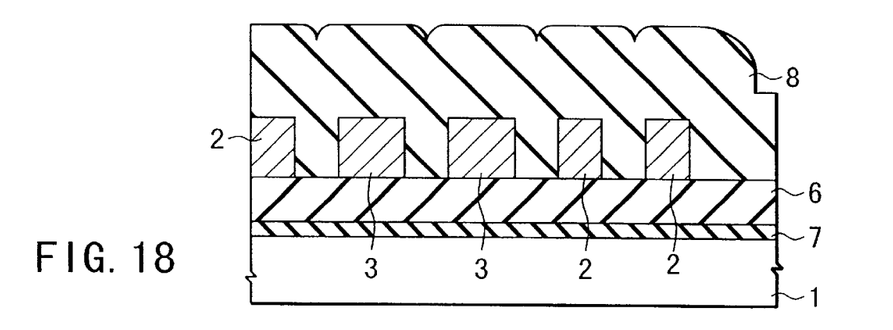
FIG. 18 is a sectional structural diagram for explaining a manufacturing process of a semiconductor device of the present invention.
Figure 19:
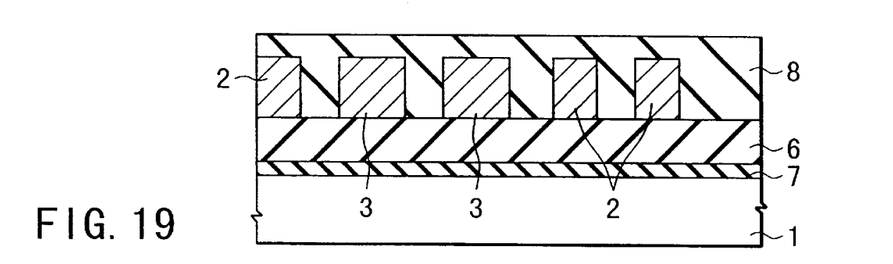
FIG. 19 is a sectional structural diagram for explaining a manufacturing process of a semiconductor device of the present invention.

Then, as shown in FIG. 18, an $SiO_2$ interlayer insulating film 8 is deposited in 14000 angstroms by plasma CVD technology. Next, as shown in FIG. 19, the $SiO_2$ interlayer insulating film 8 is flattened by CMP technology so that the first layer metals 2, 3 may not be exposed.

Figure 20:
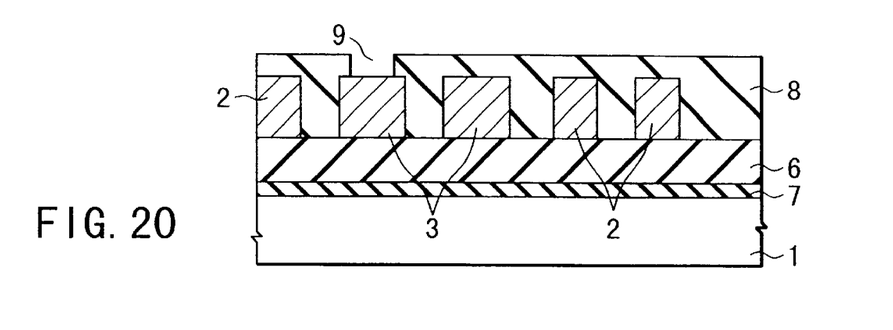
FIG. 20 is a sectional structural diagram for explaining a manufacturing process of a semiconductor device of the present invention.
Figure 21:
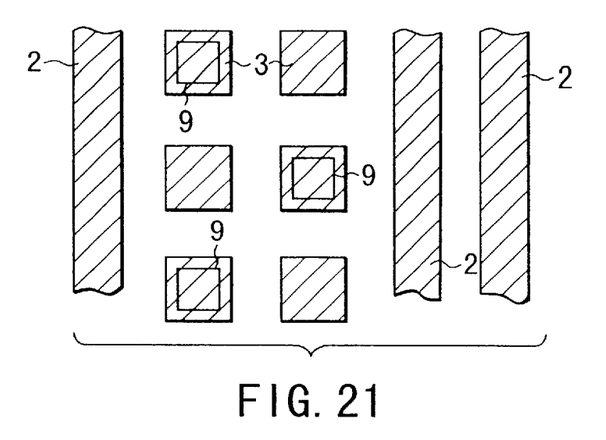
FIG. 21 is a plan view for explaining a manufacturing process of a semiconductor device of the present invention.

Consequently, as shown in FIG. 20, by lithographic technology, opening holes 9 for dummy pattern etching are formed selectively in the interlayer insulating film 8. A plan view at this time is shown in FIG. 21. Of the divided dummy patterns, only those free from problem in strength when cavities are formed are opened to form holes 9.

Figure 22:
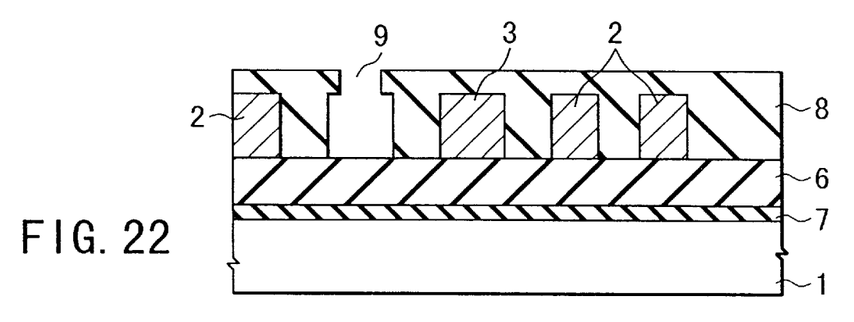
FIG. 22 is a sectional structural diagram for explaining a manufacturing process of a semiconductor device of the present invention.
Figure 23:
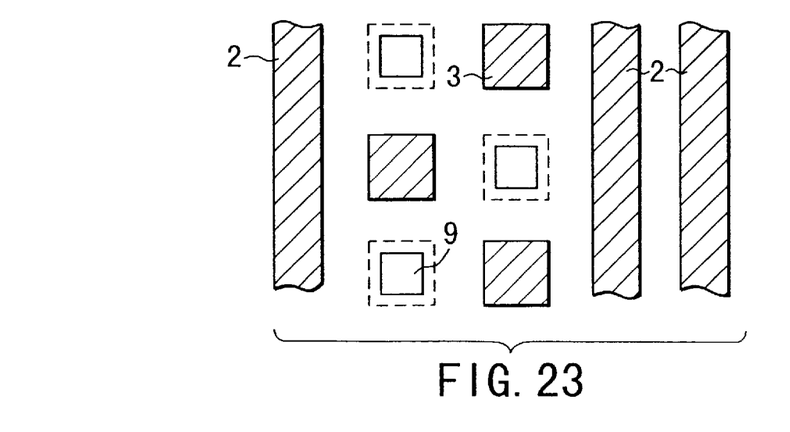
FIG. 23 is a plan view for explaining a manufacturing process of a semiconductor device of the present invention.

As shown in FIG. 22, by a chemical solution mixing sulfuric acid and hydrogen peroxide, the first layer metal pattern used as dummy pattern is selectively removed. FIG. 23 shows a plan view at this time. The arranged dummy patterns are removed so as to be free from problem in strength.

Figure 24:
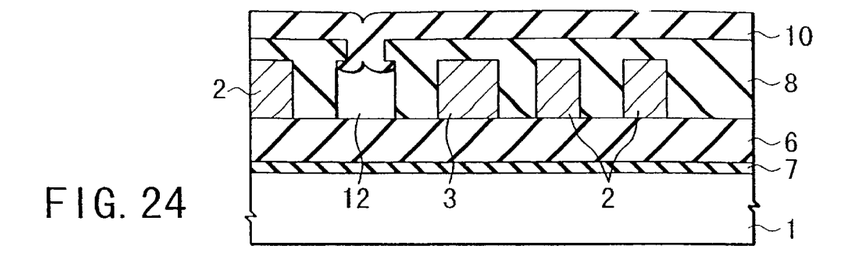
FIG. 24 is a sectional structural diagram for explaining a manufacturing process of a semiconductor device of the present invention.

Next, as shown in FIG. 24, to plug the holes 9 opened for removing the dummy pattern, an $SiO_2$ interlayer insulating film 19 is deposited in 7000 angstroms again by plasma CVD technology. As a result, the holes 9 are filled with the insulating film. Then, a through-hole for coupling the metal of the first layer and the metal of the second layer is formed by lithographic technology and reactive ion etching technology (not shown).

Figure 25:
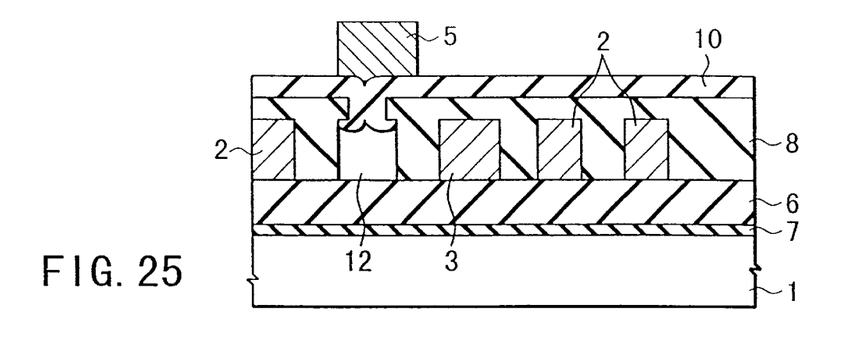
FIG. 25 is a sectional structural diagram for explaining a manufacturing process of a semiconductor device of the present invention.
Figure 26:
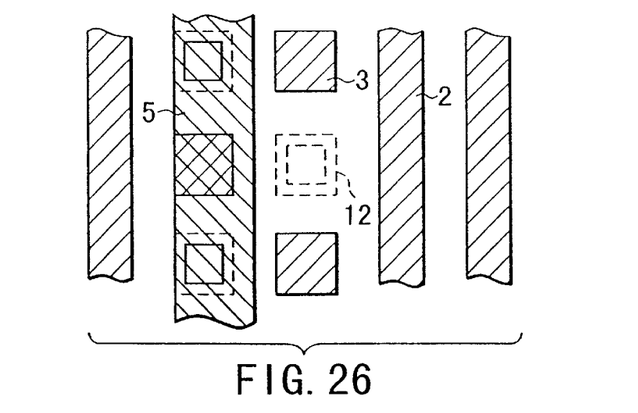
FIG. 26 is a plan view for explaining a manufacturing process of a semiconductor device of the present invention.

As the metal wiring film of the second layer, an Al—Si—Cu alloy is formed in 7000 angstroms by sputtering, and the metal wiring of the second layer is patterned by lithographic technology and reactive ion etching technology as shown in FIG. 25. As a result, the wiring 5 used as the signal line of the metal wiring of the second layer is formed. FIG. 26 is a plan view at this time. Then, a passivation film is formed by a known technology, the pad portion is selectively opened as electrode.

In the description of the foregoing embodiments, the first layer metal is used in forming the dummy pattern, but SiN, poly-Si, carbon or the like may be also used. When such material is used, by forming films of such materials after forming the metal wiring of the first layer, and patterning the films by lithographic technology, the dummy patterns can be formed.

As described herein, according to the present invention, the flatness of the CMP can be enhanced by using the dummy pattern, and the parasitic capacity of the wiring can be substantially decreased. In the circuit design, moreover, metal wiring of floating is not needed, and the difficult of circuit design is extremely improved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   first wiring patterns formed on the first insulating film and extending in a first direction;
   a second insulating film formed on the first insulating film and the first wirings;
   a plurality of cavities and at least one dummy pattern formed in the second insulating film and which are formed between the first wiring patterns and have the same height as the first wiring patterns, regions between the cavities and the first wiring patterns being filled with the second insulating film; and
   a second wiring formed above the second insulating film and extending in the first direction, the second wiring being located above the cavities.

2. A new semiconductor device according to claim 1, further comprising a third insulating film formed on the second insulating film, and wherein said second wiring is formed on the third insulating film.

3. A semiconductor device according to claim 1, wherein at least part of said second wiring is located right above at least one of the cavities.

4. A semiconductor device according to claim 1, wherein the plurality of cavities are arranged in the first direction.

5. A semiconductor device according to claim 1, further comprising a plurality of dummy patterns arranged in the first direction between the first wiring patterns.

* * * * *